US012796535B2

(12) United States Patent
Chen et al.

(10) Patent No.: US 12,796,535 B2
(45) Date of Patent: Nov. 10, 2026

(54) SEMICONDUCTOR DEVICE WITH PROTECTIVE LAYER

(71) Applicant: SANDISK TECHNOLOGIES, INC., Milpitas, CA (US)

(72) Inventors: Joyce Chen, Taichung (TW); CC Liao, Taichung (TW); Angela Wang, Taichung (TW); Panny Chen, Taichung (TW); Tim Huang, Shanghai (CN); Bo Fu, Shanghai (CN); Leo Shen, Taichung (TW); JinXiang Huang, Shanghai (CN); Olga Chen, Taichung (TW)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 784 days.

(21) Appl. No.: 17/673,150

(22) Filed: Feb. 16, 2022

(65) Prior Publication Data

US 2023/0260949 A1 Aug. 17, 2023

(51) Int. Cl.
*H10W 90/00* (2026.01)
*H10W 72/00* (2026.01)
(Continued)

(52) U.S. Cl.
CPC ......... *H10W 90/00* (2026.01); *H10W 72/013* (2026.01); *H10W 72/0198* (2026.01);
(Continued)

(58) Field of Classification Search
CPC ... H01L 25/50; H01L 25/065; H01L 25/0655; H01L 25/0657; H01L 25/037; H01L 25/074; H01L 2225/06506; H01L 2225/06575; H01L 2225/0651; H01L 2225/06562; H01L 2224/29082; H01L 2224/2919; H01L 2224/32147; H01L 2224/83379; H01L 2224/8385; H01L 23/3157; H01L 23/293; H01L 23/3171; H01L 24/32; H01L 24/27; H01L 24/29; H01L 24/83; H01L 24/97; H10W 72/013;
(Continued)

(56) References Cited

U.S. PATENT DOCUMENTS 6,756,252 B2 6/2004 Nakanishi
2004/0014309 A1 1/2004 Nakanishi
(Continued)

*Primary Examiner* — Leonard Chang
*Assistant Examiner* — Stanetta D Isaac
(74) *Attorney, Agent, or Firm* — Morgan, Lewis & Bockius LLP

(57) ABSTRACT

A semiconductor device includes a first semiconductor die having a top planar surface and a second semiconductor die having a bottom planar surface and a top planar surface. A protective layer including a bottom planar surface and a top planar surface is positioned between the first semiconductor die and the second semiconductor die. An adhesive layer having a top planar surface and a bottom planar surface is between the protective layer and the second semiconductor die. A periphery of the top planar surface of the first semiconductor die is covered by a periphery of the bottom planar surface of the protective layer after cutting a portion of the protective layer that extended past the periphery of the surface of the first semiconductor die. The protective layer reduces the occurrence of peeling of the second semiconductor die and first semiconductor die coupled to the protective layer.

10 Claims, 4 Drawing Sheets

(51) Int. Cl.
*H10W 72/30* (2026.01)
*H10W 72/90* (2026.01)

(52) U.S. Cl.
CPC ........ *H10W 72/322* (2026.01); *H10W 72/354* (2026.01); *H10W 72/951* (2026.01); *H10W 90/732* (2026.01)

(58) Field of Classification Search
CPC ........... H10W 72/0198; H10W 72/322; H10W 72/354; H10W 72/951; H10W 90/732; H10W 74/131; H10W 90/00; H10W 90/231; H10W 90/24; H10W 90/752; H10W 90/754
See application file for complete search history.

(56) References Cited

U.S. PATENT DOCUMENTS

2012/0013026 A1 1/2012 Han
2015/0155199 A1 6/2015 Kim et al.

SEMICONDUCTOR DEVICE WITH PROTECTIVE LAYER

BACKGROUND

The present invention generally relates to semiconductor devices and, more particularly, to semiconductor devices having a protective layer configured to reduce the occurrence of die peeling.

Semiconductor devices often include multiple semiconductor dies coupled to one another via one or more adhesive layers. The semiconductor dies and adhesive layers may be stacked one on top of another, and a protective layer is often provided on a surface of at least one of the semiconductor dies in order to protect any electrical interfaces and/or metal layers on the die surface. In conventional semiconductor devices, the protective layer is provided between a top surface of a die and an adhesive layer. The protective layer often increases the risk of die peeling due to lack of surface area to which the adhesive layer may adhere and/or to gaps caused by the protective layer into which a molding compound may flow. Therefore, there is a need to provide a protective layer which reduces the risk of die peeling in semiconductor dies.

BRIEF SUMMARY OF THE INVENTION

In one embodiment there is a semiconductor device including a first semiconductor die having a top planar surface, a second semiconductor die having a bottom planar surface and a top planar surface, a protective layer including a bottom planar surface and a top planar surface, the protective layer positioned between the first semiconductor die and the second semiconductor die, and an adhesive layer having a top planar surface and a bottom planar surface, the adhesive layer positioned between the protective layer and the second semiconductor die. A periphery of the top planar surface of the first semiconductor die is covered by a periphery of the bottom planar surface of the protective layer after cutting a portion of the protective layer that extended past the periphery of the surface of the first semiconductor die.

In some embodiments, the protective layer includes a plurality of apertures extending from the top planar surface of the protective layer to the bottom planar surface of the protective layer. In some embodiments, a portion of the adhesive layer extends through the plurality of apertures in the protective layer such that the portion of the adhesive layer contacts the first semiconductor die. In some embodiments, the plurality of apertures are positioned proximate the periphery of the protective layer. In some embodiments, a periphery of the protective layer is substantially planar with the periphery of the first semiconductor die. In some embodiments, the protective layer is configured to reduce the occurrence of peeling of the adhesive layer from the protective layer. In some embodiments, a periphery of the bottom planar surface of the adhesive layer contacts the periphery of the top planar surface of the protective layer. In some embodiments, the protective layer includes one of a polymer and a polyimide.

In another embodiment there is a method of manufacturing a semiconductor device including providing a first semiconductor die having a top planar surface, providing a second semiconductor die having a bottom planar surface and a top planar surface, positioning a protective layer between the first semiconductor die and second semiconductor die, the protective layer having a top planar surface, a bottom planar surface, and a portion that extends past a periphery at the top planar surface of the first semiconductor die, positioning an adhesive layer between the protective layer and the second semiconductor die, the adhesive layer having a top planar surface and a bottom planar surface, and cutting the protective layer between the first semiconductor die and the second semiconductor die such that the periphery at the top planar surface of the first semiconductor die is covered by a periphery of the protective layer.

In some embodiments, the protective layer includes a plurality of apertures extending from the top planar surface of the protective layer to the bottom planar surface of the protective layer. In some embodiments, the method further includes filling the plurality of apertures of the protective layer with a portion of the adhesive layer such that the portion of the adhesive layer contacts the first semiconductor die. In some embodiments, the plurality of apertures are positioned proximate the periphery of the protective layer. In some embodiments, the periphery of the protective layer is substantially planar with the periphery of the first semiconductor die. In some embodiments, the protective layer is configured to reduce the occurrence of peeling of the adhesive layer from the protective layer. In some embodiments, a periphery of the bottom planar surface of the adhesive layer contacts the periphery of the top planar surface of the protective layer. In some embodiments, the protective layer includes one of a polymer and a polyimide.

In another embodiment there is a semiconductor device assembly including a substrate having a top planar surface, a plurality of semiconductor devices coupled to the top planar surface of the substrate, the plurality of semiconductor devices arranged in an array having at least two columns and one row, each semiconductor device of the plurality of semiconductor devices including a first semiconductor die having a top planar surface, a second semiconductor die having a bottom planar surface and a top planar surface, a protective layer including a bottom planar surface and a top planar surface, the protective layer positioned between the first semiconductor die and the second semiconductor die, an adhesive layer having a top planar surface and a bottom planar surface, and the adhesive layer positioned between the protective layer and the second semiconductor die. A periphery of the top planar surface of the first semiconductor die is covered by a periphery of the bottom planar surface of the protective layer, and one or more protective layers include a protrusion extending beyond the periphery of the top planar surface of the first semiconductor die.

In some embodiments, the protective layers of at least two adjacent semiconductor devices are integrally formed with one another. In some embodiments, each semiconductor device of the plurality of semiconductor devices is spaced from one another such that at least one scribe line is formed between semiconductor devices included in different columns of the array. In some embodiments, the protrusion included in the one or more protective layers of the semiconductor devices arranged in the same row of the array extends across at least one scribe line.

BRIEF DESCRIPTION OF THE SEVERAL VIEWS OF THE DRAWINGS

The foregoing summary, as well as the following detailed description, will be better understood when read in conjunction with the appended drawings. For the purpose of illustrating the present disclosure, there are shown in the drawings embodiments which are presently preferred wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
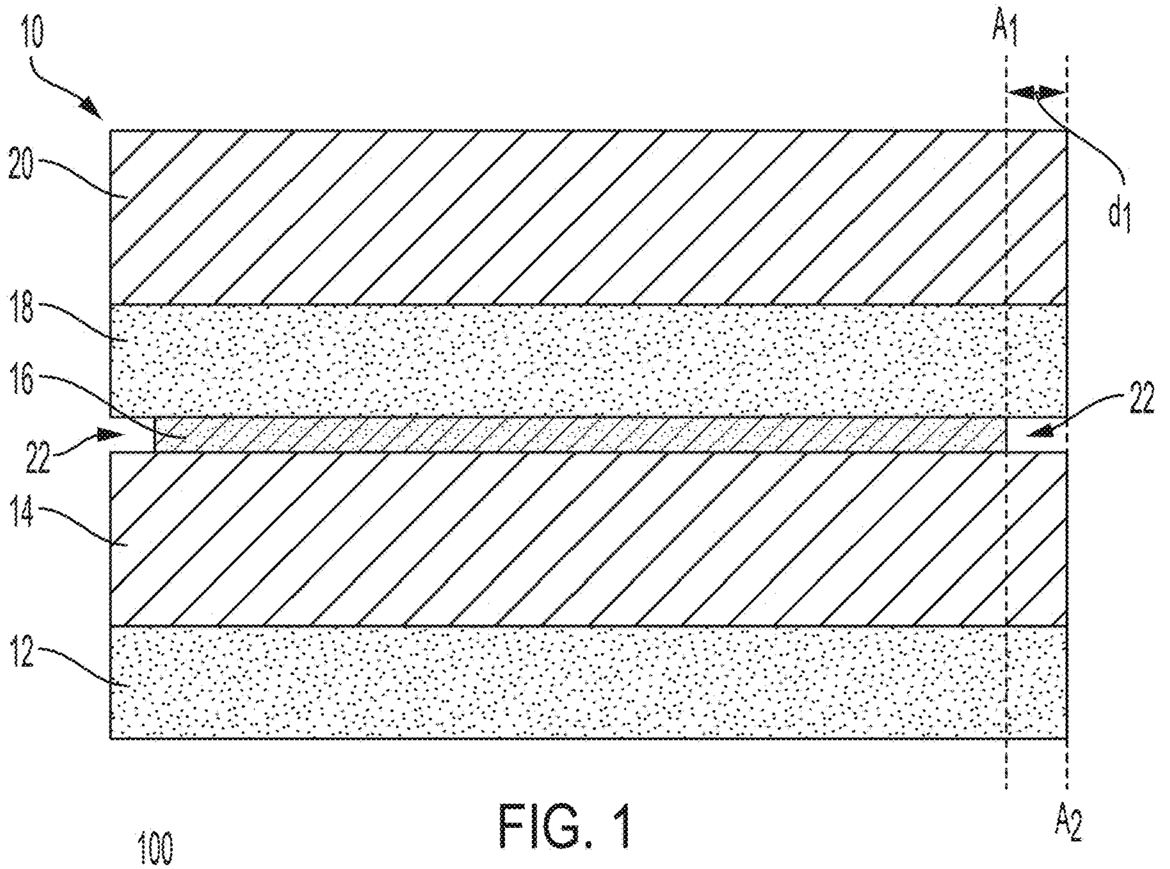
FIG. 1 is a side cross-sectional illustration of a conventional semiconductor device package.

Referring to FIG. 1, there is shown a cross-sectional side view of a conventional semiconductor device, generally designated 10. The semiconductor device 10 includes a first adhesive layer 12, a first semiconductor die 14, a protective layer 16, a second adhesive layer 18, and a second semiconductor die 20, each stacked one on top of another. As shown in the conventional semiconductor device 10, the protective layer 16 does not entirely cover the first semiconductor die 14. The side surface of the protective layer 16 extends along the first axis A1 and the side surface of the first semiconductor die 14 extends along a second axis A2 which is offset from the first axis A1 by a distance di such that the side surface of the protective layer 16 is not planar with the side surface of the first semiconductor die 14 or, in other words, the periphery of the protective layer 16 does not cover the periphery of the first semiconductor die 14. As shown in FIG. 1, the protective layer 16 is offset on the opposite side in a similar manner. In this manner, gaps 22 are formed between the first semiconductor die 14 and the second adhesive layer 18. As such, the gaps 22 defined by the protective layer 16 increase the risk of peeling of the second adhesive layer 18 from the protective layer 16. For instance, a molding compound (e.g., an epoxy molding compound (EMC)), when being flowed over the semiconductor device 10 may enter into the gaps 22 such that the molding compound applies a force to at least one of the first semiconductor die 14 and second adhesive layer 18, thereby causing the adhesive layer 18 to at least partially peel from the protective layer 16. Additionally, the portions of the second adhesive layer 18 that are proximate the gaps 22 (e.g., the portions that do not contact the protective layer 16) are not adhered to a surface, thereby reducing the strength of the adhesive bond between the protective layer 16 and second adhesive layer 18. In this manner the risk of peeling is increased as well.

Figure 2:
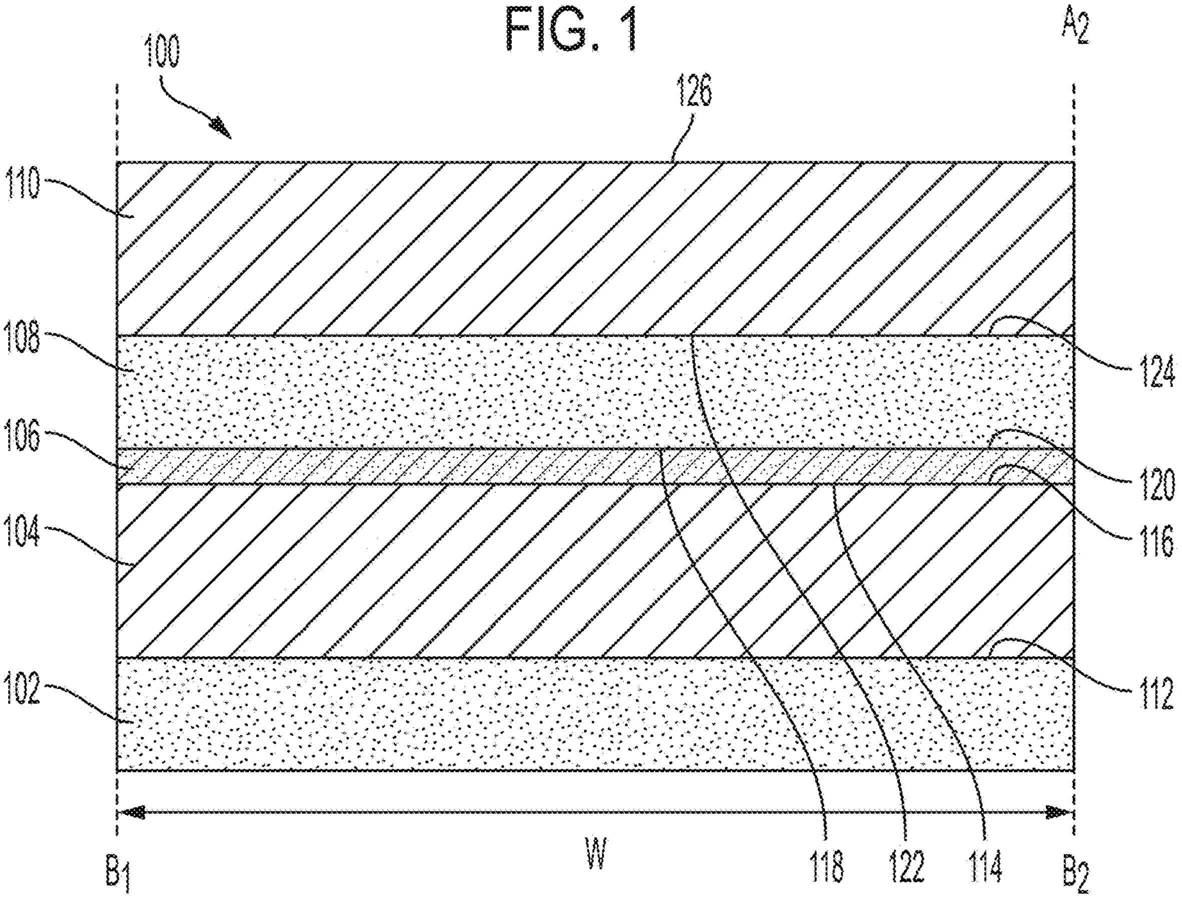
FIG. 2 is a side cross-sectional illustration of a semiconductor device in accordance with an exemplary embodiment of the present disclosure.

Referring to FIG. 2, there is shown a side cross-sectional side view of a semiconductor device, generally designated 100, in accordance with an exemplary embodiment of the present disclosure. The semiconductor device 100 may include a first adhesive layer 102, a first semiconductor die 104, a protective layer 106, a second adhesive layer 108 and a second semiconductor die 110. The semiconductor device 100 may be any type of semiconductor device, such as a system-in-package (SiP). In some embodiments, the first semiconductor die 104 and/or the second semiconductor die 110 is/are memory dies such as, but not limited to, NAND dies. The first adhesive layer 102 and/or second adhesive layer 108 may be an adhesive film (e.g., a die attach film (DAF) that is conductive or non-conductive) configured to adhere one or more components of the semiconductor device to one another. For example, the first adhesive layer 102 may adhere the first semiconductor device 104 to a substrate (not shown) or another semiconductor device or die (not shown).

The protective layer 106 may be configured to protect one or more surfaces of the first semiconductor die 104 from external forces (e.g., impacts during use, manufacture, and/or assembly). In some embodiments, the protective layer 106 includes a polymer, metal, plastic, and/or a composite material. In some embodiments, the protective layer 106 includes polyimide. The protective layer 106 may substantially cover a surface of the first semiconductor die 104 where electrical interfaces and/or metal layers of the first semiconductor die 104 are disposed. In some embodiments, the protective layer 106 includes electrical connections (e.g., copper traces) within the protective layer such that the protective layer 106 and first semiconductor die 104 may be electrically connected to one another.

The components of the semiconductor device 100 may be vertically stacked one on top of another and bonded one to another to form the semiconductor device 100. In some embodiments, the first semiconductor die 104 may be coupled to a top planar surface 112 of the first adhesive layer 102. In this manner, the first semiconductor die 104 is adhered to and positioned above the adhesive layer 102. The protective layer 106 may include a bottom planar surface 114 that is coupled to the top planar surface 116 of the first semiconductor die 104. In some embodiments, the protective layer 106 is adhered to the first semiconductor die 104. For example, the protective layer 106 may have adhesive qualities such that an adhesive bond is formed between the bottom planar surface 114 of the protective layer 106 and the top planar surface 116 of the first semiconductor die 104. In some embodiments the protective layer 106 is adhered to the first semiconductor die 104 using a spin coating process.

The second adhesive layer 108 may be coupled to and positioned above the protective layer 106. For example, the bottom planar surface 118 of the second adhesive layer 108 may be coupled to the top planar surface 120 of the protective layer 106. In this manner, the second adhesive layer 108 and the protective layer 106 may be adhered to one another. As such, the protective layer 106 may couple the first semiconductor die 104 and the first adhesive layer 102 to the second adhesive layer 108. The second semiconductor die 110 may be coupled to and positioned above the second adhesive layer 108. For example, the bottom planar surface

122 of the second semiconductor die 110 may be coupled to the top planar surface 124 of the second adhesive layer. In this manner, the second adhesive layer 108 and second semiconductor die 110 may be adhered to one another. As such, the first adhesive layer 102, first semiconductor die 104, protective layer 106, second adhesive layer 108, and second semiconductor die 110 may be adhered one to another and vertically stacked, one on top of another, to form the semiconductor device 100. The bottom and top planar surfaces of the first adhesive layer 102, first semiconductor die 104, protective layer 106, second adhesive layer 108, and the second semiconductor die 110 may be generally parallel to one another.

Although the semiconductor device 100 illustrated in FIG. 2 includes two semiconductor dies and a single protective layer, it will be understood that the same stacking structure illustrated may be repeated to increase the number of semiconductor dies included in the semiconductor device package 100. For example, a second protective layer (not shown) that is generally the same as protective layer 106 may be coupled to the top planar surface 126 of the second semiconductor die 110. In this manner, another adhesive layer and/or semiconductor die may be coupled to the top planar surface of the second protective layer, similar to how the second adhesive layer 108 and second semiconductor die 110 are coupled to the protective layer 106. As such, it will be understood that the semiconductor device 100 may include any number of dies, adhesive layers, and protective layers stacked one on top of another and arranged in a similar manner to what is shown and described with reference to FIG. 2.

In some embodiments, each of the first adhesive layer 102, first semiconductor die 104, protective layer 106, second adhesive layer 108, and second semiconductor die 110 has generally the same width. For example, each of the above-noted components may have a width W as measured in a direction perpendicular to a first axis $B_1$ and a second axis $B_2$. Although not shown, the length of each of the first adhesive layer 102, first semiconductor die 104, protective layer 106, second adhesive layer 108, and second semiconductor die 110 may be generally equal such that the sides of each of the components are planar. The length of each of the above-noted components may be measured in a direction normal to the width or, put another way, in a direction normal to the page in FIG. 2. In some embodiments, the top planar surface of each component may be substantially covered by the bottom planar surface of the component immediately above it. For example, the top planar surface 116 of the first semiconductor die 104 is entirely covered by the bottom planar surface 114 of the protective layer 106. Put another way, the periphery at the top planar surface 116 of the first semiconductor die 104 may be covered by the periphery of the bottom planar surface 114 of the protective layer 106. Put yet another way, the periphery of the first semiconductor die 104 may be substantially flush with the periphery of the protective layer 106.

As such, there may be no gap formed between the second adhesive layer 108 and first semiconductor die 104. Put another way, the protective layer 106 of the present disclosure entirely fills the space between the first semiconductor die 104 and second adhesive layer such that a gap (e.g., the gap 22 in the conventional semiconductor device 10 of FIG. 1) is not formed. In some embodiments, the protective layer 106 is configured to prevent, or at least reduce, the occurrence of peeling of one or more of the components of the semiconductor device 100 from one or more other components of the semiconductor device 100. For example, by providing the protective layer 106 between the first semiconductor die 104 and second adhesive layer 108 such that a gap is not formed between the first semiconductor die 104 and second adhesive layer 108, the protective layer 106 may prevent, or at least reduce, the occurrence of peeling of the second adhesive layer 108 from the protective layer 106. As described above with reference to FIG. 1, the gap 22 formed in conventional semiconductor devices (e.g., conventional semiconductor device 10) increases the risk of die peeling due to the flowing of a molding compound and/or the reduced surface area upon which adhesion may occur. The gap 22 of the conventional semiconductor device 10 and die-peeling risk will not be described in full detail again for sake of brevity. It will be understood that by providing the protective layer 106 of the present disclosure, as described above, a gap is not formed and the surface area to which the second adhesive layer 122 may adhere is increased when compared to the conventional semiconductor device 10. As such, the semiconductor device 100 of the present disclosure may be configured to reduce the occurrence of peeling.

Figure 3:
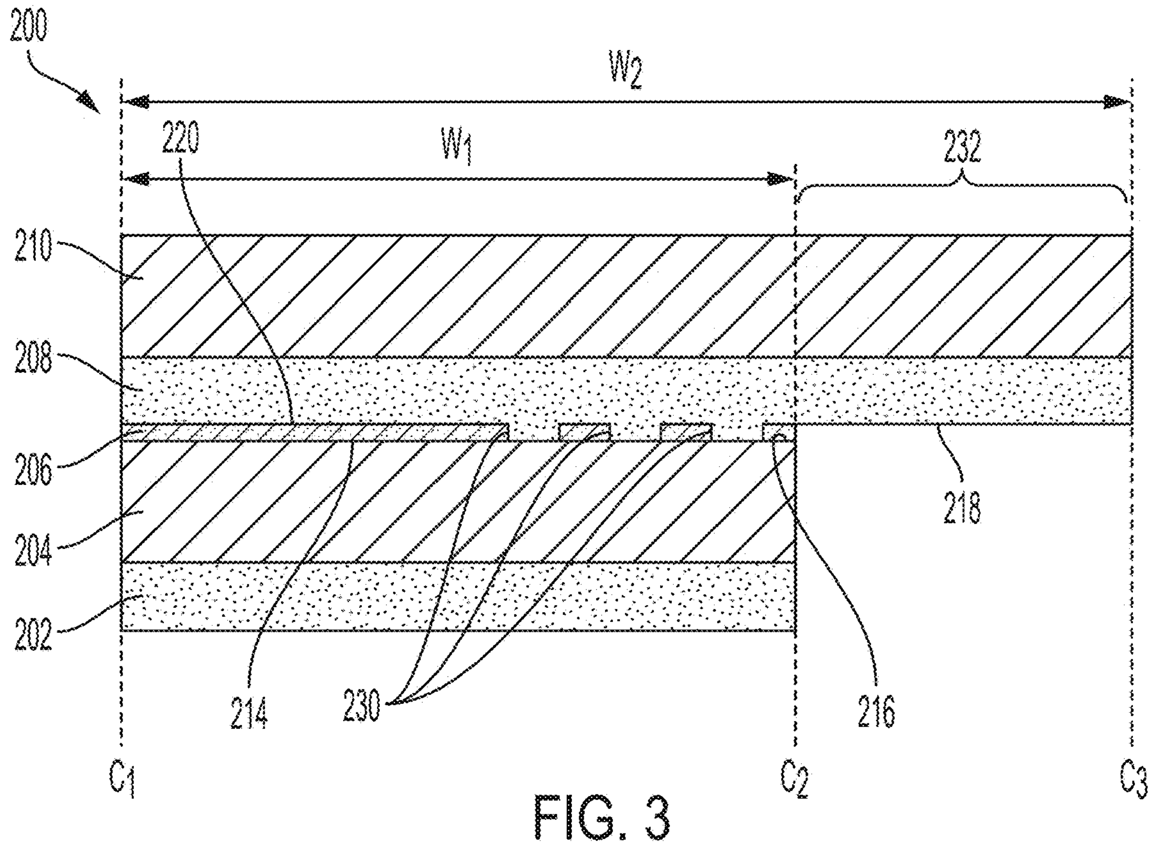
FIG. 3 is a side cross-sectional illustration of a semiconductor device in accordance with another exemplary embodiment of the present disclosure.

Referring to FIG. 3, there is shown a side cross-sectional view of a semiconductor device, generally designated 200, in accordance with an exemplary embodiment of the present disclosure. The semiconductor device 200 may be similar to the semiconductor device 100 shown in FIG. 2, except that one or more of the adhesive layers and/or semiconductor dies may have a different size than one or more other adhesive layers and/or semiconductor dies. For example, semiconductor device 200 may include a first adhesive layer 202, a first semiconductor die 204, and a protective layer 206, each having a width $W_1$ as measured in a direction perpendicular to both of a first axis $C_1$ and second axis $C_2$. A first side planar surface of each of the first adhesive layer 202, first semiconductor die 204, and protective layer 206 may be generally aligned with the first axis $C_1$ and a second side planar surface, opposite the first side planar surface, may be generally aligned with the second axis $C_2$.

The semiconductor device 200 may include a second adhesive layer 208 and a second semiconductor die 210 each having a width $W_2$ as measured in a direction perpendicular to both of the first axis $C_1$ and a third axis $C_3$. For example, a first side planar surface of each of the second adhesive layer 208 and second semiconductor die 210 may be generally aligned with the first axis $C_1$ and a second side planar surface, opposite the first side planar surface, may be generally aligned with a third axis $C_3$. The third axis $C_3$ may be offset from the second axis $C_2$ such that the distance from the third axis $C_3$ to the first axis $C_1$ is greater than the distance from the second axis $C_2$ to the first axis $C_1$. As such, the width $W_1$ of the first adhesive layer 202, first semiconductor die 204, and protective layer 206 may be less than the width $W_2$ of the second adhesive layer 208 and second semiconductor die 210. Although not shown, each of the first adhesive layer 202, first semiconductor die 204, protective layer 206, second adhesive layer 208, and second semiconductor die 210 may have a generally equal length. The length being measured in a direction normal to the direction in which the width is measured or, to put it another way, as measured in a direction normal to the page in FIG. 3.

The semiconductor device 200 may include an exposed portion 232 that is the portion of the second semiconductor die 210 and second adhesive layer 208 that is positioned between the second axis $C_2$ and third axis $C_3$. During assembly and/or use of the semiconductor device 200, a force may be exerted upon the exposed portion 232, for example, a force exerted on the bottom planar surface 218 of the second adhesive layer 208 along the exposed portion 232 by the flowing of a molding compound during assembly of the semiconductor device 200. In some embodiments, the protective layer 206 is configured to prevent, or at least reduce, the occurrence of peeling. The protective layer 206 may be similar to the protective layer 106 of semiconductor device 100 shown in FIG. 2 and may prevent, or at least reduce the occurrence of, peeling for the same reasons discussed above with reference to the protective layer 106. For example, the protective layer 206 is sized such that there is no gap in the semiconductor device 200 between the first axis $C_1$ and second axis $C_2$ within which a molding compound may flow.

The protective layer 206 may be different from the protective layer 106 in that the protective layer 206 of semiconductor device 200 includes one or more apertures 230 configured to increase the strength of the adhesive bond between the second adhesive layer 208 and at least one of the protective layer 206 and first semiconductor die 204. The apertures 230 may each extend through the thickness of the protective layer 206 from the top planar surface 220 to the bottom planar surface 214 of the protective layer 206. As such, each aperture 230 may be defined by one or more inner side walls formed in the protective layer 206 that extend from the top planar surface 220 to the bottom planar surface 214. In some embodiments, each aperture 230 may be spaced from one another and may extend along a portion of the width $W_1$ and/or length of the protective layer 206. In some embodiments, the apertures 230 are positioned on the protective layer 206 such that they are proximate the side planar surface of the protective layer 206 that is generally aligned with the second axis $C_2$. Put another way, the apertures 230 may be positioned on the protective layer 206 such that the distance from any one of the apertures 230 to the second axis $C_2$ is less than the distance from the apertures 230 to the first axis $C_1$. In some embodiments, at least one of the apertures 230 may be positioned generally equidistantly between the first axis $C_1$ and second axis $C_2$.

In some embodiments, a portion of the second adhesive layer 208 is configured to substantially fill the apertures 230. For example, during assembly of the semiconductor device 200, the second adhesive layer 208 may be heated such that the second adhesive layer 208 forms an adhesive bond with the protective layer 206 and/or the second semiconductor die 210. When heated, the viscosity of the adhesive layer 208 may increase such that a portion of the adhesive layer 208 may fill the apertures 230. In this manner, a portion of the adhesive layer 208 may substantially fill the apertures 230 such that a portion of the adhesive layer 208 is adhered to the inner side walls of the protective layer 206 that define the apertures 230 and adhered to the sections of the top planar surface 216 of the first semiconductor die 204 that are exposed through the apertures 230. As such, the adhesive layer 208 may be adhered to the top planar surface 220 of the protective layer 206, the inner side walls defining the apertures 230, and to portions of the top planar surface of the first semiconductor die 204, thereby increasing the adhesive strength of the second adhesive layer 208 to the protective layer 206 and first semiconductor die 204. By increasing the adhesive strength of the second adhesive layer 208 to the components of the semiconductor device 200 via apertures 230, as described herein, the protective layer 206 may prevent or at least reduce the occurrence of peeling of the second adhesive layer 208 and, therefore, the second semiconductor die 210.

In some embodiments, the protective layer 206 and the portions of the second adhesive layer 208 that extend through the apertures 230 entirely cover the top planar surface 216 of the first semiconductor die 204. The periphery at the top planar surface 216 of the first semiconductor die 204 may be covered by the periphery of the bottom planar surface 214 of the protective layer 206. Put another way, the periphery of the first semiconductor die 204 may be substantially flush with or planar with the periphery of the protective layer 206. Although three apertures 230 are illustrated in FIG. 3, it will be understood that the protective layer 206 may define any number of apertures 230. In some embodiments, the protective layer 206 defines at least one aperture 230. In some embodiments, the protective layer 206 defines between one and thirty apertures 230. In some embodiments, each of the apertures may be generally the same size and/or shape. For example, each of the apertures 230 illustrated in FIG. 3 may be generally circular in shape, when viewed from the top, each being defined by generally the same radius. In other embodiments, at least one of the apertures 230 has a different size and/or shape than at least one or more other apertures 230. For example, the apertures 230 may be generally circular in shape but at least one may be defined by a larger or smaller radius than at least one of the other circular apertures.

Figure 4:
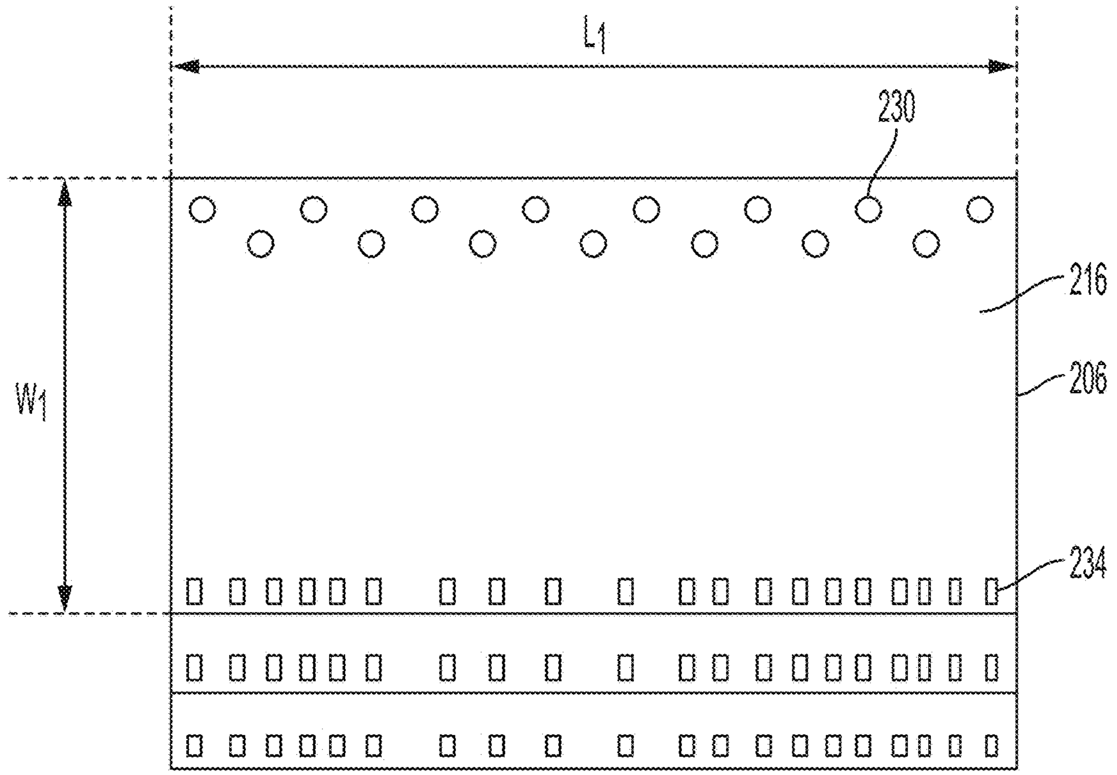
FIG. 4 is a top elevational cross-sectional illustration of a stacked semiconductor device including the semiconductor device of FIG. 3.

As mentioned above, the apertures 230 may be spaced along the width and/or length of the protective layer 206. For example, there is shown in FIG. 4 a top elevational cross-sectional view of a stacked semiconductor device including semiconductor device 200. In FIG. 4, the second adhesive layer 208 and second semiconductor die 210 are not shown in order to illustrate the arrangement of the apertures 230. As shown, the apertures 230 are arranged in two rows that extend substantially along the length $L_1$ of the protective layer 206. The apertures 230 are arranged in a zig-zag pattern; however, it will be understood that the apertures 230 may be arranged in any desired pattern. In some embodiments, the apertures 230 are positioned on the protective layer 206 such that they do not overlap with any electrical connectors 234 that are accessible via the protective layer 206. For example, in FIG. 4 the apertures 230 are positioned opposite the electrical connectors 234 that are accessible via the top planar surface 216 of the protective layer 206. The electrical connectors 234 may be electrical contact points where bond wires may be electrically connected such that electrical signals may be sent to and from the semiconductor device.

Although not shown, it will be understood that apertures similar to apertures 230 may be included in the protective layer 106 shown in FIG. 2. For example, protective layer 106 may include one or more apertures generally similar to apertures 230, such that a portion of the second adhesive layer 108 may substantially fill the apertures similar to how a portion of the second adhesive layer 206 fills apertures 230 in semiconductor device 200. In this manner, the second adhesive layer 108 of the semiconductor device 100 may be adhered at least partially to the first semiconductor die 104 and to the protective layer 106 to increase the adhesive strength between the second adhesive layer 108, protective layer 106, and the first semiconductor die 104.

Figure 5:
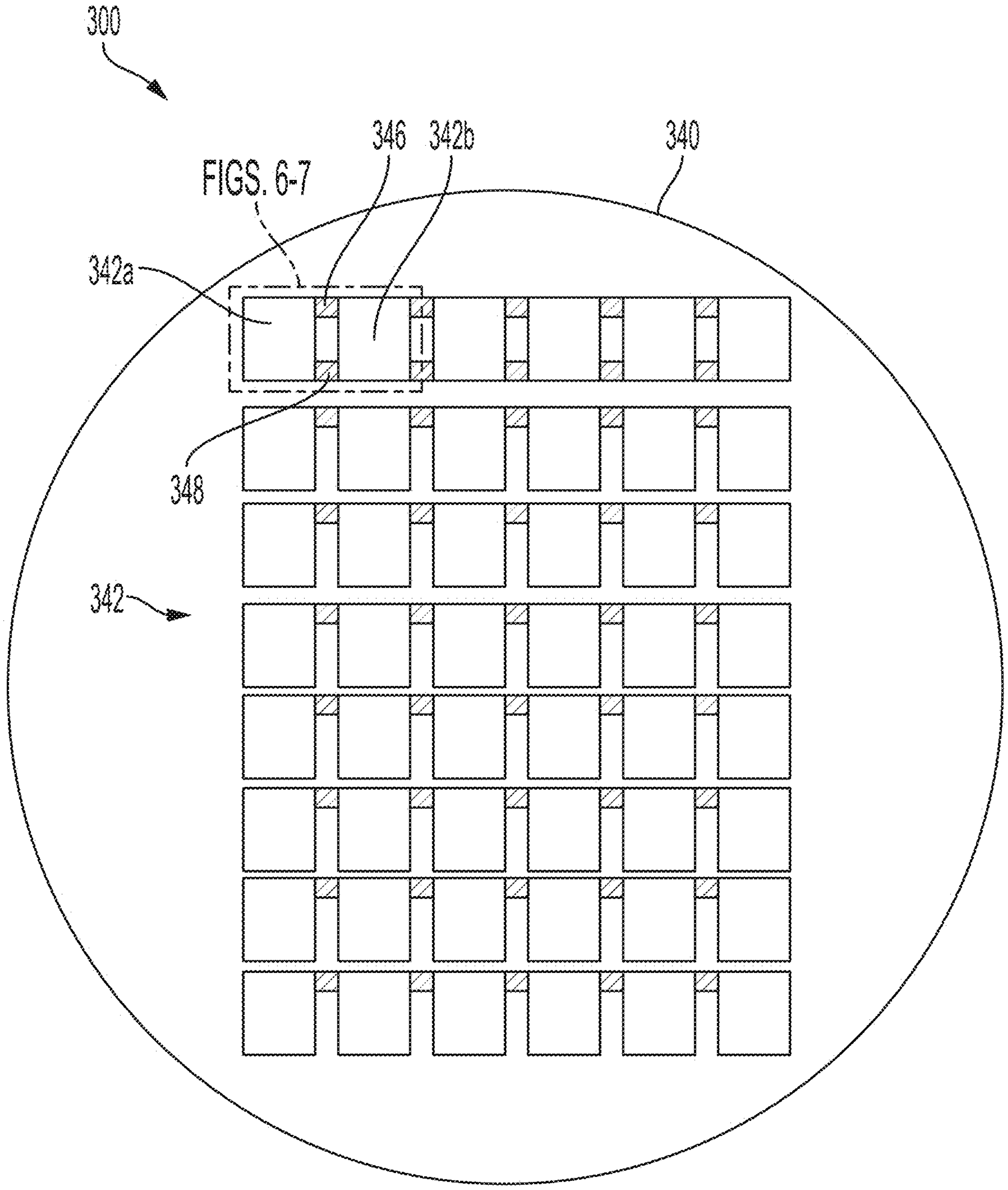
FIG. 5 is a top elevational illustration of a wafer including a plurality of semiconductor devices in accordance with an exemplary embodiment of the present disclosure.

Referring to FIG. 5, there is shown a semiconductor device package, generally designated 300, that includes a plurality of semiconductor devices, in accordance with an exemplary embodiment of the present disclosure. The semiconductor device package 300 may include a substrate 340 and two or more semiconductor devices (e.g., semiconductor device 342*a* and semiconductor device 342*b*) coupled thereto. Although two semiconductor devices, 342*a* and 342*b*, are referenced in FIG. 5, each of the semiconductor devices illustrated in FIG. 5 may generally be referred to as semiconductor device 342. In some embodiments, the semiconductor devices 342 are arranged in an array or a grid layout that includes at least one row and two columns of semiconductor devices (e.g., semiconductor devices 342*a* and 342*b*). For example, in FIG. 5 there is a total of 48 semiconductor devices 342 coupled to substrate 340 and arranged in eight rows and six columns. When referencing the position of semiconductor devices 342 in the array, it will be understood that the top-left-most semiconductor device (e.g., the semiconductor device marked 342 in FIG. 5) is positioned in the first row and first column. Column numbers increase when moving left to right and row numbers increase when moving top to bottom from what is shown in FIG. 5. For example, the bottom-right-most semiconductor device 342 is the semiconductor device in the eighth row and sixth column.

In some embodiments, the substrate 340 may be a wafer that is used in the fabrication of semiconductor devices (e.g., integrated circuits). For example, individual semiconductor devices 342 may be formed on substrate 340 and spaced from one another such that each of the semiconductor devices 342 is mechanically and/or electrically coupled to the substrate 340. One or more cuts may be made to the substrate 340, in the spaces between the individual semiconductor devices 342, to form individual packages each including at least one semiconductor device 342 coupled to a portion of the substrate 340. In some embodiments, there is a protective layer that extends across each of the semiconductor devices 342 that are positioned in at least the same row in the array to prevent or reduce the occurrence of peeling during cutting of the substrate 340. For example, cutting of the substrate 340 occurs in the spaces between adjacent semiconductor dies and there may be one or more protrusions 346, 348 of a protective layer that extend across that space to prevent or reduce the occurrence of peeling during cutting of the substrate 340. The configurations of the protective layer, protrusions 346 and 348, and adjacent semiconductor devices will be better understood with reference to FIGS. 6-7.

Figure 6:
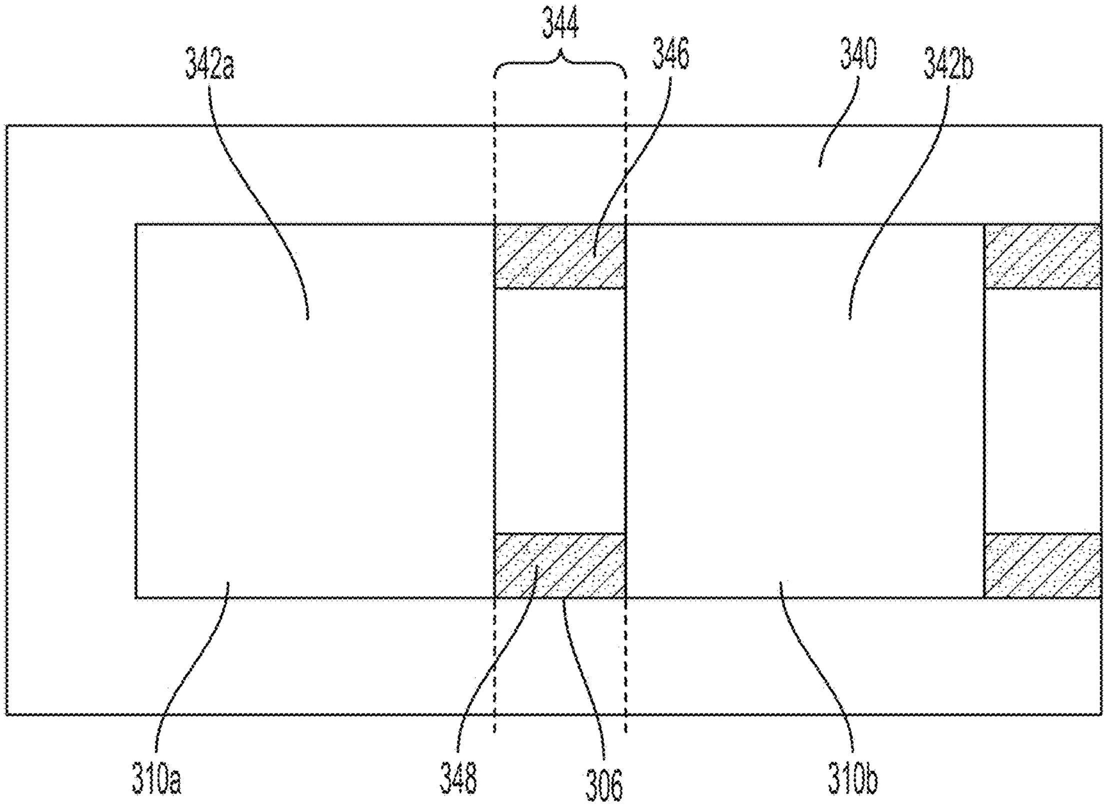
FIG. 6 is a magnified top elevational illustration of the wafer of FIG. 5 with two semiconductor devices.
Figure 7:
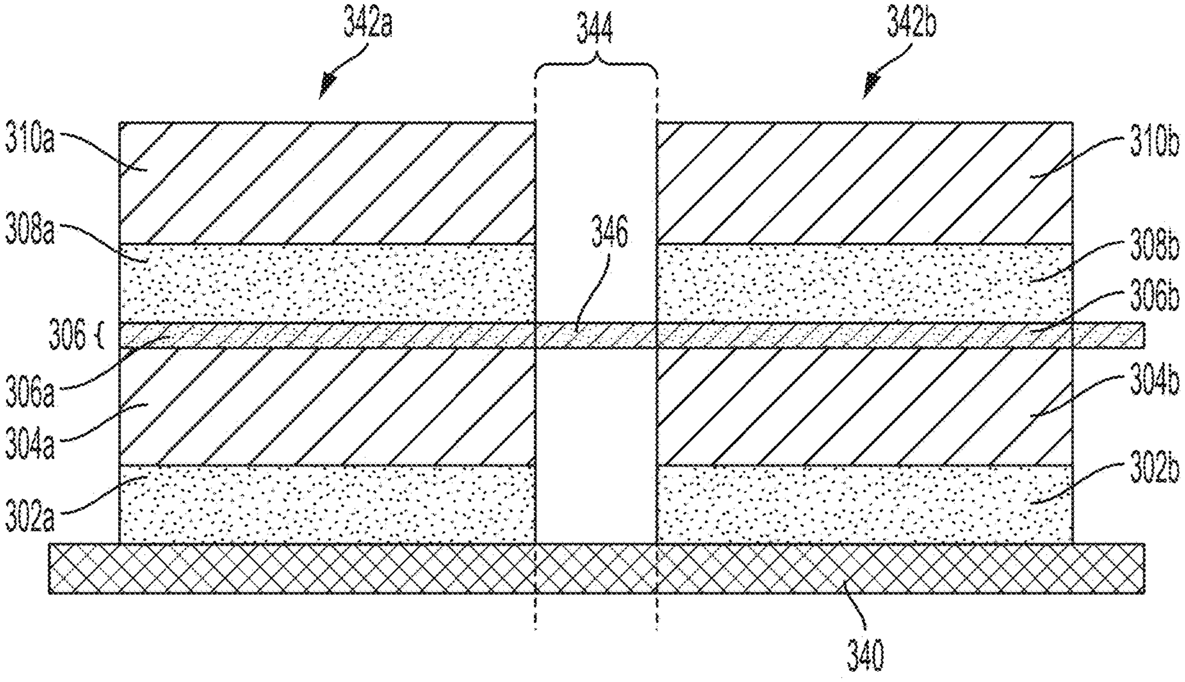
FIG. 7 is a magnified side cross-sectional illustration of the wafer of FIG. 5 with two semiconductor devices.

Referring to FIGS. 6-7, there is illustrated a section of the substrate 340 with the two semiconductor devices 342*a*-342*b* coupled thereto prior to any cuts being made to the substrate 340. In FIGS. 6-7, the first semiconductor device 342*a* is positioned in the first row and first column of the array and the second semiconductor device 342*b* is positioned in the first row and second column. The first semiconductor device 342*a* and second semiconductor device 342*b* may be generally the same as the semiconductor device 100 shown in FIG. 2. For example, each semiconductor device 342*a* and 342*b* may include a corresponding first adhesive layer 302*a*-302*b*, first semiconductor die 304*a*-304*b*, a protective layer including a first portion 306*a* and second portion 306*b*, second adhesive layer 308*a*-308*b*, and second semiconductor die 310*a*-310*b*. Each of the first adhesive layer 302*a*-302*b*, first semiconductor die 304*a*-304*b*, first and second portions 306*a*-306*b* of the protective layer 306, second adhesive layer 308*a*-308*b*, and second semiconductor die 310*a*-310*b* may be generally similar to the corresponding components of the first semiconductor device 100 and will not be described again in full detail for sake of brevity.

As mentioned above, the semiconductor devices (e.g., the first semiconductor device 342*a* and second semiconductor device 342*b*) are spaced from one another on the substrate 340. For example, there may be a space 344 between the first semiconductor device 342*a* and second semiconductor device 342*b*. The space 344 may be alternatively referred to as a scribe line or saw street and it may be the space within which a cutting tool is used to cut the substrate 340. In some embodiments there is another portion, or protrusion, of the protective layer 306 that extends from the first semiconductor device 342*a* across space 344 to the second semiconductor device 342*b*. For example, the first portion 306*a* of protective layer 306 and the second portion 306*b* of the protective layer 306 are coupled to one another by one or more protrusions (e.g., first protrusion 346 and second protrusion 348) that extend across space 344. As such, the protective layer 306 may include the first portion 306*a*, second portion 306*b*, the first protrusion 346 and second protrusion 348. The first protrusion 346 and/or second protrusion 348 may be comprised of the same material(s) as the first portion and second portion 306*a*, 306*b* of the protective layer 306. For example, the first portion and second portion 306*a* and 306*b* and the first and second protrusion 346 and 348 of the protective layer 306 may be comprised of polyimide.

In some embodiments, the first protrusion 346 and second protrusion 348 are integrally formed with the first and second portions 306*a*, 306*b* of the protective layer 306. In this manner, the first and second portions 306*a*, 306*b* and the protrusions 346, 348 form a protective layer 306 that is unitary in construct and that entirely covers the first semiconductor devices 304*a*, 304*b* of the first and second semiconductor devices 342*a*, 342*b*. In some embodiments, one of protrusions 346, 348 may not be included. For example, the first portion 306*a* and second portion 306*b* of the protective layer 306 may be coupled to one another and/or integrally formed with one another via the first protrusion 346. In some embodiments, the shape and/or size of the first protrusion 346 and/or second protrusion 348 may be different from what is shown. For example, in FIG. 6 each protrusion 346, 348 is generally rectangular and sized such that there is a gap between the protrusions 346, 348; however, the protrusions 346, 348 may be sized such that the gap between them is greater or less than what is shown. In some embodiments, the protrusions 346 and 348 are positioned proximate one or more corners of the semiconductor devices 342*a*, 342*b*.

In some embodiments, the protective layer 306 is formed via a spin coating process. For example, the protective layer 306 may be provided via a spin coating process and then heated. An ultraviolet (UV) light mask may be applied to the spin coated protective layer 306. The masked protective layer may undergo photolithography in order to produce a desired shape and/or pattern for the protective layer 306. In some embodiments, the protective layer 306 may undergo development by being exposed to a developing solution. The protective layer 306 exposed to the developing solution may be heated in order to produce the finished protective layer 306.

It will be understood that although two semiconductor devices 342*a*, 342*b* are shown in FIGS. 6-7, the protective layers of adjacent semiconductor devices may be coupled to one another via protrusions similar to the first protrusion 346 and/or second protrusion 348. For example, and referring to FIG. 5, semiconductor devices 342 that are positioned along the same row in the array on substrate 340 may include respective portions of the protective layer 306, similar to the first portion 306*a* and second portion 306*b*, that is integrally formed and extends across the space between each adjacent semiconductor device similar to what is shown in FIGS. 6-7. For example, the protective layer 306 may include protrusions, generally similar to protrusions 346, 348, that are coupled to respective portions of the protective layer 306 and that extend across the space between adjacent semiconductor devices. As shown in FIG. 5, each semiconductor device 342 positioned in the first row includes two protrusions that are integrally formed with the respective portions of the protective layer 306 of the adjacent semiconductor devices. The protrusions extend across the space between the columns of semiconductor devices 342 such that the protective layer 306 is integrally formed and is directly coupled to each of the semiconductor devices 342 in that row. In some embodiments, a single protrusion may extend across the space between adjacent semiconductor devices such that the protective layer 306 is integrally formed. For example, in the second row (e.g., the row immediately below the first row in FIG. 5), the semiconductor devices 342 include a single protrusion that extends across the space between adjacent semiconductor devices in the same row. As such, the semiconductor devices in the second row each also include a respective portion of the protective layer 306 that is integrally formed and extends across the space between adjacent semiconductor devices 342 in the second row.

Although the protrusions in FIG. 5 are illustrated as extending across the spaces between adjacent semiconductor devices in the same row, it will be understood that there may be protrusions that extend across the space between adjacent semiconductor devices in the same column. For example, each semiconductor device may include one or more protrusions that extend across the space between adjacent semiconductor devices positioned in the same row, positioned in the same column, or both. It will also be understood that the protrusions extending between adjacent semiconductor devices need not be the same as one or more other protrusions extending between one or more other adjacent semiconductor devices. For example, there may be two protrusions of a first size and shape that each extend between semiconductor devices positioned in the first row, first and second column, and there may be a single protrusion of a second size and shape, different from the first size and shape, that extends between semiconductor devices positioned in the first row, second and third column. For sake of brevity, all possible combinations will not be discussed herein; however, it will be understood that the protective layers of adjacent semiconductor devices are integrally formed with one another via the protrusions.

By providing one or more protrusions (e.g., first protrusion 346 and/or second protrusion 348) that extend across the space between adjacent semiconductor devices 342, the risk of peeling may be reduced and/or prevented during cutting of the substrate 340 with respect to conventional semiconductor devices. For example, protective layers in conventional semiconductor devices do not entirely cover the surface of semiconductor dies included therein as described above. Furthermore, during manufacture when the semiconductor devices are coupled to a wafer (e.g., a substrate similar to substrate 340), the protective layers of the semiconductor devices do not extend across the space where cuts will be made to the wafer. As such, there is a gap between the protective layers of adjacent semiconductor devices. By providing the integrally formed protective layer 306, as shown and described with reference to FIGS. 5-7, that extends across adjacent semiconductor dies, there may be no gap formed between protective layers after cutting of the substrate 340 to form semiconductor devices 342, thereby increasing the adhesive strength of the components of the semiconductor devices 342. As such, the risk of die peeling may be prevented or at least reduced.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor device comprising:

a first semiconductor die having a top planar surface;

a second semiconductor die having a bottom planar surface and a top planar surface;

a protective layer including a bottom planar surface, a top planar surface, and a plurality of apertures extending from the top planar surface of the protective layer to the bottom planar surface of the protective layer, the protective layer positioned on the top planar surface of the first semiconductor die between the first semiconductor die and the second semiconductor die; and an adhesive layer having a top planar surface and a bottom planar surface, the adhesive layer positioned on the top planar surface of the protective layer between the protective layer and the second semiconductor die such that the top planar surface of the adhesive layer contacts the bottom planar surface of the second semiconductor die, a portion of the adhesive layer extending through the plurality of apertures in the protective layer and directly contacting the first semiconductor die, wherein a periphery of the top planar surface of the first semiconductor die is covered by a periphery of the bottom planar surface of the protective layer.

2. The semiconductor device of claim 1, wherein the plurality of apertures are positioned proximate the periphery of the protective layer.

3. The semiconductor device of claim 2, wherein a periphery of the protective layer is substantially planar with the periphery of the first semiconductor die.

4. The semiconductor device of claim 1, wherein the protective layer is configured to reduce the occurrence of peeling of the adhesive layer from the protective layer.

5. The semiconductor device of claim 1, wherein a periphery of the bottom planar surface of the adhesive layer contacts the periphery of the top planar surface of the protective layer.

6. The semiconductor device of claim 1, wherein the protective layer includes one of a polymer and a polyimide.

7. A semiconductor device assembly comprising:

a substrate having a top planar surface;

a plurality of semiconductor devices coupled to the top planar surface of the substrate and offset from one another such that there is a space between each of the semiconductor devices of the plurality of semiconductor devices, the plurality of semiconductor devices arranged on the top planar surface of the substrate in an array having at least two columns and one row, each semiconductor device of the plurality of semiconductor devices comprising:

a first semiconductor die having a top planar surface;

a second semiconductor die having a bottom planar surface and a top planar surface; and an adhesive layer having a top planar surface and a bottom planar surface, the adhesive layer positioned between the first semiconductor die and the second semiconductor die, and a continuous protective layer extending across the space between separate semiconductor devices of the plurality of semiconductor devices and being positioned between the top surface of the first semiconductor die and bottom planar surface of the adhesive layer of each of the adjacent semiconductor devices such that the protective layer at least partially covers the top surface of the first semiconductor die of each of the adjacent semiconductor device and directly contacts the adhesive layer of each of the adjacent semiconductor devices, wherein a periphery of the top planar surface of the first semiconductor die is covered by a periphery of the bottom planar surface of the protective layer.

8. The semiconductor device assembly of claim 7, wherein the protective layer is a continuous layer that extends between the adjacent semiconductor devices of the plurality of semiconductor devices.

9. The semiconductor device package of claim 7, wherein each semiconductor device of the plurality of semiconductor devices is spaced from one another such that at least one scribe line is formed between semiconductor devices included in different columns of the array.

10. The semiconductor device package of claim 9, wherein the protective layer includes a protrusion that extends across the at least one scribe line.

* * * * *